(12) United States Patent
Gazsi et al.

(10) Patent No.: US 6,870,879 B2
(45) Date of Patent: Mar. 22, 2005

(54) INTERPOLATION FILTER CIRCUIT

(75) Inventors: Lajos Gazsi, Düsseldorf (DE); Reinhard Stolle, Neufahrn (DE)

(73) Assignee: Infineon Technologies AG, Munich (DE)

( * ) Notice: Subject to any disclaimer, the term of this patent is extended or adjusted under 35 U.S.C. 154(b) by 726 days.

(21) Appl. No.: 09/797,244

(22) Filed: Mar. 1, 2001

(65) Prior Publication Data

US 2001/0031001 A1 Oct. 18, 2001

(30) Foreign Application Priority Data

Mar. 1, 2000  (DE) .......................................... 100 09 767

(51) Int. Cl.[7] ........................ H03K 5/159; H04L 23/00; H03M 7/00; G06F 17/17
(52) U.S. Cl. ........................ 375/229; 375/377; 341/61; 708/313
(58) Field of Search ................................. 375/229, 295, 375/350, 377; 708/290, 300, 313, 319, 320; 341/50, 61

(56) References Cited

U.S. PATENT DOCUMENTS

| | | | | |
|---|---|---|---|---|
| 4,192,008 A | * | 3/1980 | Mandeville ................. | 708/317 |
| 4,552,992 A | * | 11/1985 | Bruckert et al. .......... | 178/69 G |
| 4,561,012 A | * | 12/1985 | Acampora ................... | 348/612 |
| 5,757,683 A | * | 5/1998 | Deczky ....................... | 708/319 |
| 6,411,657 B1 | * | 6/2002 | Verbin et al. ............... | 375/285 |

FOREIGN PATENT DOCUMENTS

DE    30 44 208 A1    10/1981

OTHER PUBLICATIONS

Eugene B. Hogenauer: "An Economical Class of Digital Filters for Decimation and Interpolation", IEEE Transactions on Acoustics, Speech, and Signal Processing, vol. ASSP-29, No. 2, Apr. 1981, pp. 155–162.

Allan V. Oppenheim: "Zeitdiskrete Signalverarbeitung" [discrete-Time Signal Processing], 3$^{rd}$ ed., Oldenbourg Verlag, München, 1999, pp. 136, 376–377.

Norbert Fliege: "Multiraten-Signalverarbeitung Theorie und Anwendungen" [multi rate signal processing theory and practice], Teubner Verlag, Stuttgart, 1993, pp. 32–33.

* cited by examiner

*Primary Examiner*—Betsy L. Deppe
(74) *Attorney, Agent, or Firm*—Laurence A. Greenberg; Werner H. Stemer; Gregory L. Mayback

(57) ABSTRACT

Interpolation filter circuit for a digital communication device for the filtering and clock-rate conversion of a digital input signal received from a data source with a symbol-clock data rate, having (a) an FIR filter (4), which filters the digital input signal received with the symbol-clock data rate in such a way that, in the passband frequency range of the interpolation filter circuit (1), the power spectral density characteristic of the filtered digital output signal emitted by the interpolation filter circuit essentially coincides with a prescribed desired characteristic of the power spectral density $PSD_{des}$;

(b) a resampling filter (6) connected downstream of the FIR filter (4) for increasing the clock data rate of the digital input signal filtered by the FIR filter (4);

and having (c) an IIR filter (8), which is connected downstream of the resampling filter and filters the resampled digital signal emitted by the resampling filter (6) in such a way that, in the cutoff frequency range of the interpolation filter circuit (1), the power spectral density characteristic of the filtered digital output signal emitted by the interpolation filter circuit essentially coincides with the prescribed desired characteristic of the power spectral density $PSD_{des}$.

12 Claims, 3 Drawing Sheets

Nominal Course of the Spectral Power Density $PSD_{SOLL}$

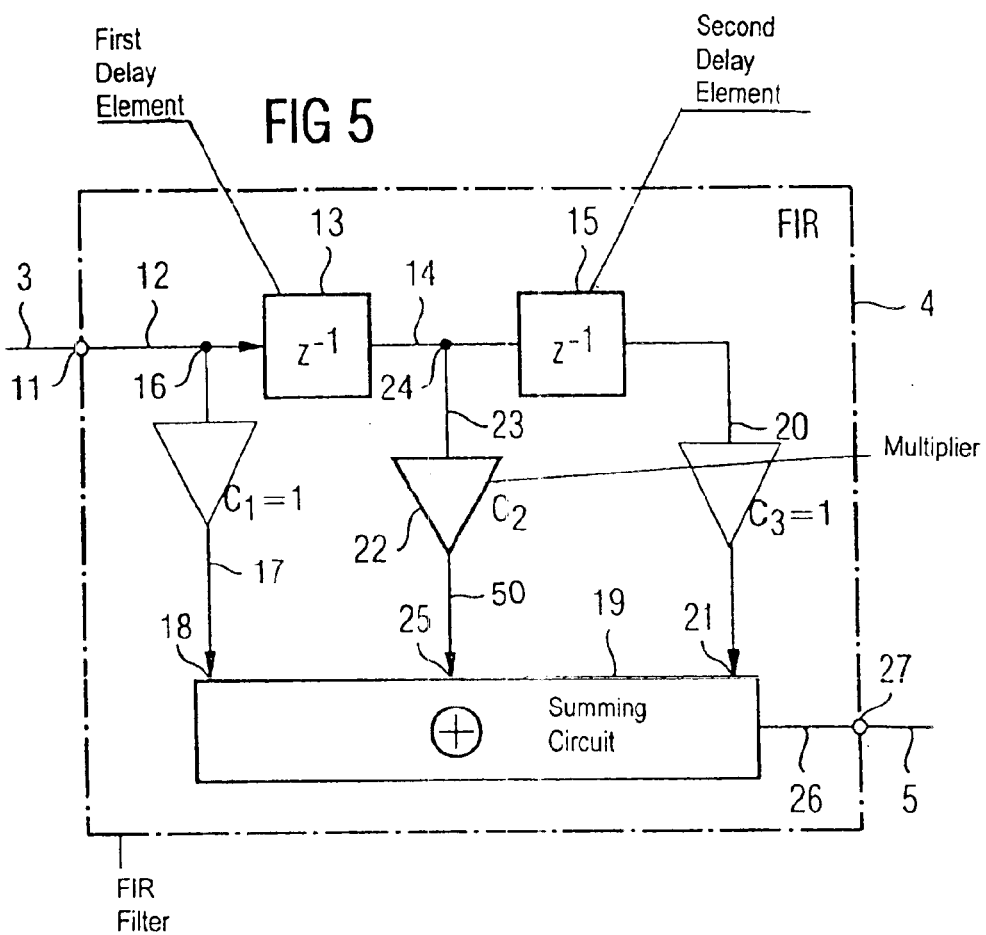
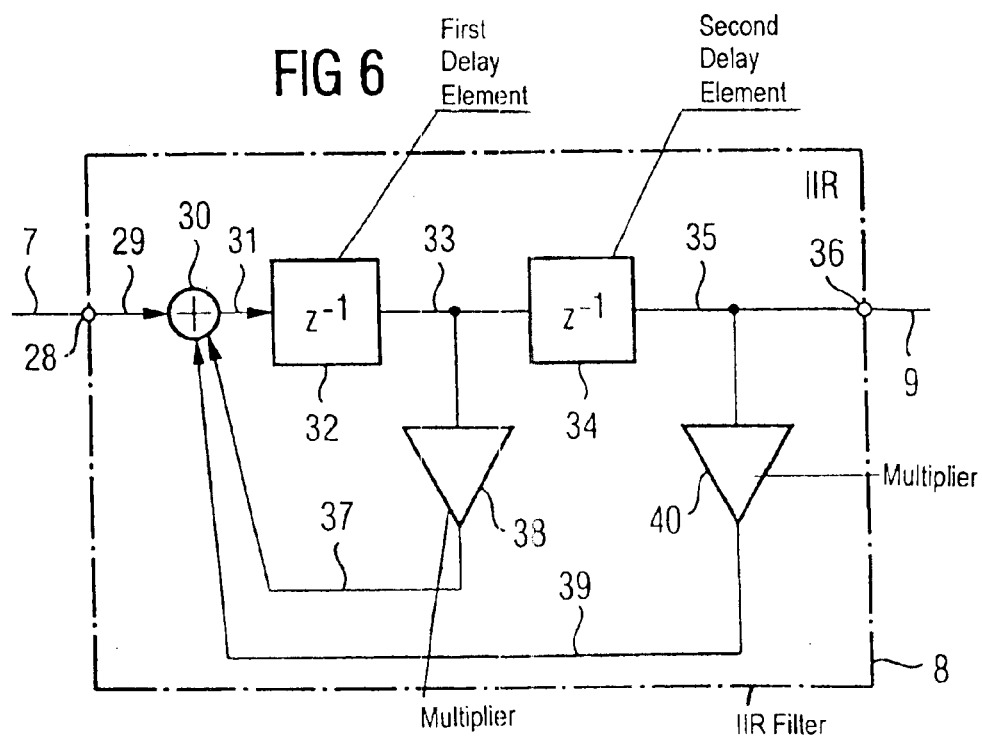

INTERPOLATION FILTER CIRCUIT

BACKGROUND OF THE INVENTION

Field of the Invention

The invention relates to an interpolation filter circuit for a digital communication device, in particular a DSL transceiver.

A DSL transceiver is a transmitting/receiving device for a digital communication network for the transmission of data and voice. In the DSL method (DSL: Digital Subscriber Line), the analog twisted two-wire lines in the exchange area of analog networks are used. In this case, the twisted two-wire lines form an analog transmission link for data transmission.

FIG. 1 shows the basic construction of a communication device which transmits digital signals via an analog transmission link to a further communication device (not shown). In this case, the communication device includes a data source for generating the digital data to be transmitted, which are emitted with a symbol-clock data rate or a data-symbol frequency $f_{symb}$ to a circuit for filtering and clock-rate conversion. Subsequently, the filtered data are converted by a digital-to-analog converter (referred to herein as a "digital/analog converter" for simplicity) for emission to the analog transmission link. The data emitted to the analog transmission link must conform to a desired characteristic for the power spectral density, which is fixed by the transmission standard.

FIG. 2 shows the desired characteristic of the power spectral density (PSD), as prescribed for example in the case of the DSL transmission method. The desired power density characteristic essentially comprises two ranges, namely a passband frequency range, in which the power spectral density PSD is constant, and a cutoff frequency range, in which the power spectral density falls with a specific edge steepness. The 3-decibel cutoff frequency is generally half the symbol-clock frequency $f_{symb}/2$.

The digital data signal emitted by the data source is filtered by the circuit for filtering and clock-rate conversion, as it is represented in FIG. 1, in the case of the conventional communication device in such a way that the characteristic of the analog output signal emitted at the digital/analog converter coincides as much as possible with the desired characteristic of the power spectral density PSD. Furthermore, an over sampling of the digital signal emitted by the data source to the high sampling frequency of the digital/analog converter takes place. The digital/analog converter may be, for example, what is known as a delta-sigma digital/analog converter. The oversampling rate (OSR) can in this case be programmed in.

FIG. 3 shows the circuit for filtering and clock-rate conversion represented in FIG. 1 in the case of the conventional communication device.

The digital input signal emitted by the data source is initially fed to a resampling filter. The resampling filter is either a holding element or a repeater circuit, or what is known as a zero-stuffing circuit. The resampling filter connected to the input has the effect of adapting the symbol-clock data rate. Connected downstream of the first resampling filter is an FIR filter (FIR: Finite Impulse Response). FIR filters are non-recursive filters or tranversal filters and their impulse response has a finite length. The FIR filter serves for impulse shaping and sets the power spectral density PSD of the analog signal emitted by the digital/analog converter in a way corresponding to the desired power density characteristic represented in FIG. 2. Connected in series downstream of the FIR filter is a further resampling filter. The second resampling filter carries out a resampling to the sampling frequency of the downstream digital/analog converter. The high sampling frequency of the downstream digital/analog converter ensures low converter noise and adequate echo signal suppression.

The second resampling filter is connected to a comb filter for further pulse shaping. The comb pulse-shaping filter sets the edge steepness in the cutoff frequency range of the power spectral density characteristic and serves for band limitation, with image frequency bands being suppressed. The filtered digital output signal emitted by the resampling filter is emitted at the output A to the digital/analog converter for conversion into the analog output signal.

The prior-art circuit for filtering and clock-rate conversion represented in FIG. 3, which is used in the case of the conventional communication device as it is represented in FIG. 1, has the disadvantage that the FIR impulse-shaping filter receives as the input signal a digital data signal with a comparatively high data rate.

$$F_{dat} = W \times f_{symb}$$

where W is typically four.

The FIR filter must therefore carry out the filtering at a high clock frequency, in order to ensure the desired power density characteristic of the analog output signal represented in FIG. 2. On account of the high data input frequency, the transmission function of the FIR filter must comprise a comparatively high number of filter coefficients F, in order that the desired power density characteristic PSD in FIG. 2 can be achieved. The high number of filter coefficients F corresponds to a high number of multipliers, adders and delay elements from which the FIR filter is constructed. With the increasing number of filter coefficients of the FIR filter, the circuitry-related expenditure increases. This ultimately leads to a higher chip area consumption of the FIR filter and consequently to higher production costs. In addition, the power consumption of the FIR filter likewise increases with the increasing number of filter coefficients of the FIR filter.

SUMMARY OF THE INVENTION

It is therefore the object of the present invention to provide an interpolation filter circuit for shaping the power spectral density characteristic of the analog output signal in which the filtering takes place with minimum circuitry-related expenditure.

The invention provides an interpolation filter circuit for a digital communication device for the filtering and clock-rate conversion of a digital input signal received from a data source with a symbol-clock data rate, having an FIR filter, which filters the digital input signal received with the symbol-clock data rate in such a way that, in the passband frequency range of the interpolation filter circuit, the power spectral density characteristic of the filtered digital output signal emitted by the interpolation filter circuit substantially coincides with a prescribed desired characteristic of the power spectral density, having a resampling filter connected downstream of the FIR filter for increasing the clock data rate of the digital input signal filtered by the FIR filter, and having an IIR (Infinite Impulse Response) filter, which is connected downstream of the resampling filter and filters the resampled digital signal emitted by the resampling filter in such a way that, in the cutoff frequency range of the interpolation filter circuit, the characteristic of the power spectral density of the filtered digital output signal emitted by the interpolation filter circuit substantially coincides with the prescribed desired characteristic of the power spectral density.

The FIR filter is preferably an FIR filter of the second order.

The FIR filter preferably has a first delay element, which is connected in series with a second delay element via a data line.

In this case, the FIR filter preferably includes a multiplier, which multiplies the data emitted by the first delay element by a filter coefficient.

The filter coefficient preferably has a value which is less than a value of −1.

In a further preferred embodiment, the FIR filter includes a summation circuit, which summates the digital input signal present at the input of the first delay element, the data signal emitted by the multiplier and multiplied by the filter coefficient and the data signal emitted by the second delay element for emitting to the resampling filter connected downstream of the FIR filter.

In a particularly preferred embodiment, the multiplier contained in the FIR filter is likewise a shift register, it being possible to set the filter coefficient to a value $C_2 = -2^n$, n being determined by the number of shifting operations in the shift register.

The IIR filter is preferably a filter of such an order that the edge steepness of the resampling filter in combination with the IIR filter corresponds to the edge steepness of the prescribed desired characteristic of the power spectral density $PSD_{des}$.

In a particularly preferred configuration, the IIR filter is a wave digital filter.

The digital communication device is preferably a DSL transceiver.

The resampling filter samples the clock data rate preferably with an oversampling rate which can be set.

In a first preferred embodiment, the resampling filter is a holding element.

In a further preferred embodiment, the resampling filter is a zero-stuffing circuit.

The resampling filter in this case preferably includes an interpolation filter.

Preferably connected downstream of the interpolation filter circuit is a digital/analog converter, which converts the filtered digital output signal with a high clock data rate into an analog transmission signal, which has essentially the prescribed desired characteristic of the power spectral density.

In a particularly preferred embodiment, the digital/analog converter is a delta-sigma digital/analog converter.

In a preferred embodiment, an anti-aliasing filter is connected downstream of the digital/analog converter.

In the text which follows, preferred embodiments of the interpolation filter circuit according to the invention are described with reference to the attached figures for explaining features essential for the invention.

BRIEF DESCRIPTION OF THE DRAWINGS

FIG. 5 shows a particularly preferred embodiment of the FIR filter contained in the interpolation filter circuit according to the invention;

FIG. 6 shows a particularly preferred embodiment of the IIR filter contained in the interpolation filter circuit according to the invention.

DESCRIPTION OF THE PREFERRED EMBODIMENTS

Figure 4:
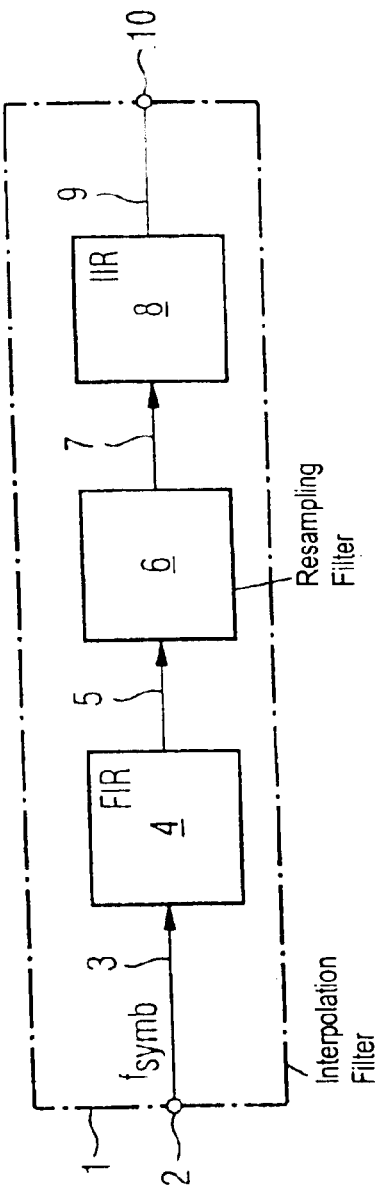
FIG. 4 shows a block diagram of the interpolation filter circuit according to the invention.

FIG. 4 shows an interpolation filter circuit 1 for a digital communication device. The interpolation filter circuit 1 has a digital input 2, via which it receives a digital input signal with a symbol-clock data rate from a data source. The digital data signal input 2 is connected via a line 3 to an FIR filter 4, which filters the digital input signal received with the symbol-clock data rate at the digital signal input 2 in such a way that, in the passband frequency range of the interpolation filter circuit, the power spectral density characteristic PSD of the filtered digital output signal emitted by the interpolation filter circuit 1 coincides essentially with a prescribed desired spectral power density characteristic $PSD_{des}$. The FIR filter emits the filtered digital input signal to a downstream resampling filter 6 via a data signal line 5. The resampling filter increases the clock data rate of the digital signal emitted by the FIR filter 4.

Figure 1:
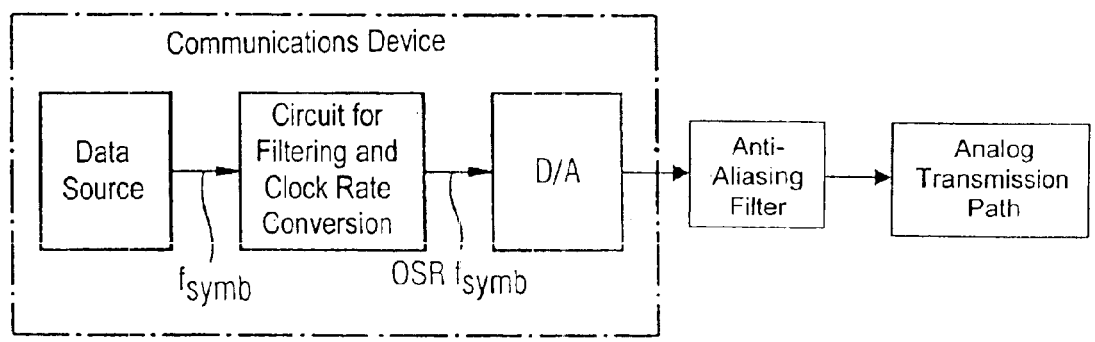
FIG. 1 shows a conventional communication device according to the prior art.
Figure 2:
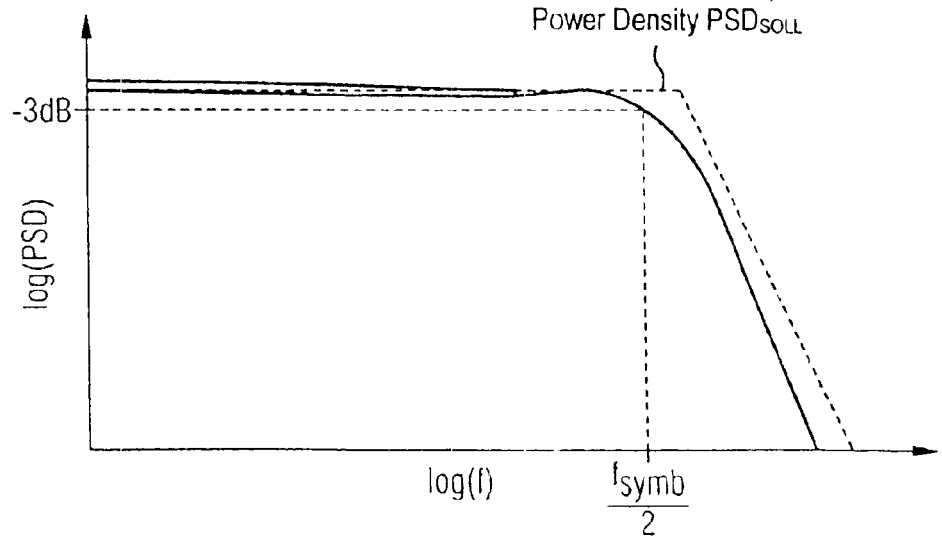
FIG. 2 shows the power spectral density characteristic of the analog output signal emitted by the communication device.
Figure 3:
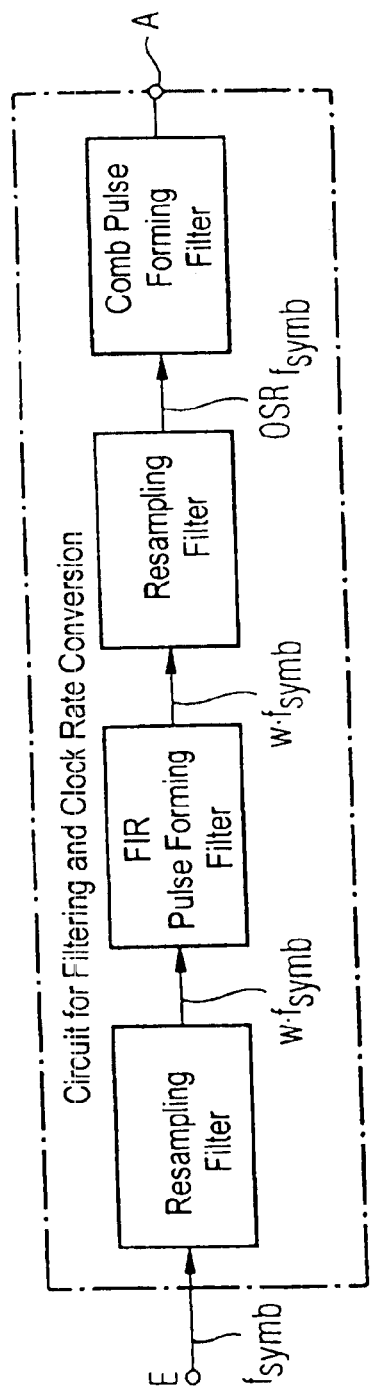
FIG. 3 shows a circuit for filtering and clock-rate conversion within the conventional communication device according to the prior art.

The signal filtered by the resampling filter 6 with an increased clock data rate is emitted via a line 7 to an IIR filter 8. The IIR filter is a recursive filter (IIR: Infinite Impulse Response), the impulse response of which (generally) has an infinite number of sampled values differing from zero. The digital signal filtered by the IIR filter 8 is emitted via a data line 9 to the output 10 of the interpolation filter circuit 1. The output 10 of the interpolation filter circuit 1 is connected to a digital/analog converter of the communication device, the digital/analog converter converting the emitted digital output signal of the interpolation filter circuit into an analog output signal, the power density characteristic PSD of which largely corresponds to the desired power density characteristic $PSD_{des}$ represented in FIG. 2.

In the case of the interpolation filter circuit 1 represented in FIG. 4, the FIR filter 4 undertakes the shaping of the power spectral density characteristic in the passband frequency range of the interpolation filter circuit, i.e. in a range in which the desired characteristic of the power spectral density is essentially constant. On the other hand, the IIR filter 8 undertakes the shaping of the power spectral density characteristic of the filtered digital output signal, emitted by the interpolation filter circuit 1, in the cutoff frequency range of the interpolation filter circuit 1, i.e. in a range in which the desired characteristic of the power spectral density falls with a specific edge steepness. This sharing of tasks allows both the FIR filter 4 and the IIR filter 8 to be configured with very low circuitry-related expenditure. The filter order of the FIR filter 4 can in this case be reduced to a very low filter order of degree 2. The filter order of the IIR filter 8 is in this case determined by the desired edge steepness of the desired characteristic of the power spectral density $PSD_{des}$. The IIR filter 8 is in this case preferably a wave digital filter WDF.

The resampling filter 6 carries out a resampling of the digital data signal emitted by the FIR filter 4, in order to achieve the relatively high sampling frequency of the downstream digital/analog converter. The downstream digital/analog converter is in this case preferably a delta-sigma digital/analog converter with a comparatively high sampling frequency, which ensures low converter noise and adequate echo signal suppression.

The FIR filter 4 receives the digital input signal which is present at the digital signal input 2, and has the symbol-clock data rate $f_{symb}$, directly via the line 3. The symbol-clock data rate of the received digital input signal which is present on the line 3 is relatively low, so that the number of necessary filter coefficients F of the FIR filter 4 for shaping the power spectral density characteristic is likewise low. In addition, the FIR filter circuit 4 merely has to undertake the shaping of the power spectral density characteristic over the passband frequency range of the interpolation filter circuit, i.e. in the range of a relatively constant power density characteristic. The FIR filter 4 therefore has a very low circuitry-related complexity.

FIG. 5 shows a particularly preferred embodiment of an FIR filter 4 contained in the interpolation filter circuit 1 according to the invention. As can be seen from FIG. 5, the FIR filter 4 is a filter of the second order with two delay elements. The FIR filter 4 has a digital signal input 11, at which the digital input signal is present. The signal input 11 of the FIR filter 4 is connected via an internal signal line 12 to a first delay element 13, which is connected in series via a data line 14 to a second delay element 15. At a branching node 16, the data line 12 is connected via a line 17 to a first input 18 of a summing circuit 19. The output of the second delay element 15 is likewise directly connected via a line 20 to a second input 21 of the summing circuit 19.

The FIR filter 4 has a multiplier 22, which multiplies the digital data signal emitted by the first delay element 13 by a filter coefficient $C_2$. For this purpose, the multiplier 22 is connected on the input side via a line 23 to a branching node 24 with the connecting line 14 between the two delay elements 13, 15, and is connected on the output side via a line 50 to a third input 25 of the summing circuit 19.

The summing circuit 19 summates the input signals present in its signal inputs 18, 21, 25 and emits the summated digital data signal via a line 26 to an output 27 of the FIR filter 4. The output 27 of the FIR filter 4 is connected via a line 5 to the downstream resampling filter 6. The resampling filter 6 samples the filtered digital output signal that is emitted by the FIR filter, with an oversampling rate that can be set. The resampling filter can include an interpolation filter. The resampling filter can be a holding element. The resampling filter also can be a zero-stuffing circuit.

The input of the first delay element 13 is connected via a line 17 directly to the first input of the summation circuit 19, and the output of the second delay element 15 is connected via a line 20 directly to the second input 21 of the summation circuit 19, so that the two filter coefficients $C_1$ and $C_3$ of the FIR filter 4 have the value 1.

The second filter coefficient $C_2$ is set by the multiplier 22 and preferably has a value which is less than the value F=−1.

The following therefore applies:

$C_1 = 1$ $C_2 < -1$ $C_3 = 1$

It generally applies that:

$C_1 = C_3$ $C_2 \leq -C_1$ $C_2 \leq -C_3$

The multiplier 22 is preferably constructed as a shift register, it being possible for the filter coefficient $C_2$ to be set correspondingly:

$C_2 = -2^n$ or $C_1 = +2^n$, $C_3 = +2^n$ with $C_2 = -1$ where n is the number of shifting operations (shift left) in the multiplier 22 constructed as a shift register.

FIG. 6 shows a preferred embodiment of the recursive IIR filter 8 contained in the interpolation filter circuit 1 according to the invention. In the preferred embodiment shown in FIG. 2, the IIR filter 8 is likewise a filter of the second order. The IIR filter receives via a signal input 28 the resampled digital signal emitted by the sampling filter 6 via the data line 7. The signal input 28 is connected via a line 29 to a summing circuit 30. The summing circuit 30 is connected via a line 31 to a first delay element 32. The first delay element 32 is connected on the output side via a connecting line 33 to the input of a second delay element 34. The output of the second delay element 34 is connected via a line 35 to an output 36 of the recursive IIR filter 8. This signal output 36 of the IIR filter 8 is present at the digital/analog converter via the signal line 9. The IIR filter 8 feeds the digital signal present on the line 33 via a feedback line 37 back to the summation circuit 30. In this case, a multiplier 38 with a gain corresponding to a filter coefficient of the IIR filter is connected into the feedback line 34. The output signal of the IIR filter 8 present on the line 35 is likewise fed back to the summation circuit 30 via a further feedback line 39, with the multiplier 40 being provided in the feedback line 39. The multiplier 40 multiplies the digital output signal present on the line 35 in accordance with a further filter coefficient of the IIR filter 8.

In a particularly preferred embodiment, the IIR filter 8 is a wave digital filter. The wave digital filter WDF can in this case be programmed in such a way that it conforms to typical filter characteristics, such as a Butterworth filter, Chebyshev filter, inverse Chebyshev filter or elliptical filter, or any desired prescribable filter characteristics. A recursive IIR filter constructed as a WDF filter is distinguished by unconditional stability. In this case, the filter coefficients can be set up by a circuitry-related combination of shift registers and adders instead of by multipliers, thereby saving computing time.

The interpolation filter circuit 1 represented in FIG. 4 is of a three-stage construction and includes the FIR filter 4, the resampling filter 6 and the hR filter 8. The FIR filter 4 is preferably a filter of the second order, i.e. a filter which can be constructed with very low circuitry-related expenditure. On account of the low symbol-clock data rate at the input 11 of the FIR filter 4, the multiplier 22 within the FIR filter 4 can operate at a relatively slow speed, whereby the circuitry-related expenditure is further reduced. The low number of delay elements and multipliers and the use of shift registers instead of multipliers within the FIR filter 4 and within the IIR filter 8 have the effect of greatly reducing the chip area consumption when the interpolation filter circuit is integrated on a semiconductor chip and consequently of likewise greatly lowering the production costs. In addition, the power consumption of the interpolation filter circuit according to the invention is low on account of the low number of necessary circuit components.

We claim:

1. An interpolation filter circuit for shaping a power spectral density (PSD) of a digital output signal of a digital transmission communication device, the interpolation filter circuit performing filtering and clockrate conversion of a digital input signal received from a data source with a symbol-clock data rate, the interpolation filter circuit comprising:

- a second order Finite Impulse Response (FIR) filter for receiving the digital input signal having the symbol-clock data rate and for emitting a filtered digital output signal having an upper cutoff frequency which is equal to half the symbol-clock data rate, said FIR filter filtering the digital input signal in such a way that a power spectral density characteristic of the emitted filtered digital output signal coincides with a prescribed desired power spectral density characteristic, the desired power spectral density characteristic being constant in a passband frequency range;
- a resampling filter connected downstream of said FIR filter for increasing the clock data rate of the digital input signal filtered by said FIR filter, said resampling filter emitting a resampled digital signal; and
- a second order IIR filter connected downstream of said resampling filter and emitting a filtered digital output signal, said IIR filter for filtering the resampled digital signal emitted by the resampling filter in such a way that, in a cutoff frequency range having a lower cutoff frequency equal to half the symbol-clock data rate, a power spectral density characteristic of the filtered digital output signal emitted by said IIR filter coincides with a prescribed desired power spectral density characteristic, the desired power spectral density characteristic falling with a specific edge steepness in the cutoff frequency range;
- said FIR filter including:
- a first delay element and a second delay element;
- a data line connecting said first delay element and said second delay element into a chain;
- a first multiplier for multiplying the digital input signal by a first filter coefficient and emitting a digital data signal;
- a second multiplier for multiplying the digital data signal emitted by said first delay element by a second filter coefficient and emitting a digital data signal; and
- a third multiplier for multiplying the digital data signal emitted by said second delay element by a third filter coefficient and emitting a digital data signal;
- the second filter coefficient being not greater than the negative of the first filter coefficient, and the first filter coefficient being identical to the third filter coefficient.

2. The interpolation filter circuit according to claim 1, wherein said FIR filter includes a summation circuit for summing the digital data signal emitted by said first multiplier, the digital data signal emitted by said second multiplier, and the digital data signal emitted by said third multiplier.

3. The interpolation filter circuit according to claim 1, wherein said IIR filter has an order such that an edge steepness of the resampled digital signal resulting from said resampling filter in combination with said FIR filter corresponds to an edge steepness of the desired power spectral density characteristic.

4. The interpolation filter circuit according to claim 1, wherein said IIR filter is a wave digital filter.

5. The interpolation filter circuit according to claim 1, wherein said digital transmission communication device is a DSL transceiver.

6. The interpolation filter circuit according to claim 1, wherein said resampling filter samples the filtered digital output signal, that is emitted by said FIR filter, with an oversampling rate which can be set.

7. The interpolation filter circuit according to claim 1, wherein said resampling filter includes an interpolation filter.

8. The interpolation filter circuit according to claim 1, in combination with a digital-to-analog converter, wherein:
    said digital-to-analog converter is connected downstream of said IIR filter, and said digital-to-analog converter converts the filtered digital output signal, that is emitted by said IIR filter and that has a high clock-data rate, into an analog data signal.

9. The interpolation filter circuit according to claim 8, wherein said digital-to-analog converter is a delta-sigma digital-to-analog converter.

10. The interpolation filter circuit according to claim 1, wherein said resampling filter is a holding element.

11. The interpolation filter circuit according to claim 1, wherein said resampling filter is a zero-stuffing circuit.

12. The interpolation filter circuit according to claim 1, in combination with a digital-to-analog converter, wherein:
    said digital-to-analog converter is connected downstream of said IIR filter, and said digital-to-analog converter converts the filtered digital output signal that is emitted by said IIR filter into an analog data signal; and
    an anti-aliasing filter is connected downstream of said digital-to-analog converter.

* * * * *